(12) United States Patent
Mitra

(10) Patent No.: US 7,041,983 B2
(45) Date of Patent: May 9, 2006

(54) PLANAR GEOMETRY BURIED JUNCTION INFRARED DETECTOR AND FOCAL PLANE ARRAY

(75) Inventor: Pradip Mitra, Grand Prairie, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 662 days.

(21) Appl. No.: 09/976,559

(22) Filed: Oct. 12, 2001

(65) Prior Publication Data

US 2003/0071221 A1    Apr. 17, 2003

(51) Int. Cl.
*G01T 1/24* (2006.01)
(52) U.S. Cl. .................. 250/370.13; 438/73
(58) Field of Classification Search ........... 250/370.13; 438/73
See application file for complete search history.

(56) References Cited

U.S. PATENT DOCUMENTS

| | | | |
|---|---|---|---|
| 4,566,918 A * | 1/1986 | Irvine et al. ................ 438/509 |
| 4,956,304 A * | 9/1990 | Cockrum et al. ............ 438/73 |
| 4,961,098 A * | 10/1990 | Rosbeck et al. ............ 257/185 |
| 5,998,235 A | 12/1999 | Mitra .......................... 438/95 |
| 6,091,127 A | 7/2000 | Chandra et al. ............ 257/442 |
| 6,100,525 A | 8/2000 | Eden ........................ 250/338.1 |
| 6,198,100 B1 | 3/2001 | Eden et al. ............... 250/338.4 |

* cited by examiner

*Primary Examiner*—David Porta
*Assistant Examiner*—Shun Lee
(74) *Attorney, Agent, or Firm*—Daren C. Davis; James E. Walton

(57) ABSTRACT

The described embodiments of the present invention include a method for forming a radiation detector. A radiation absorption layer is formed on a substrate. A wider bandgap layer is formed on the radiation absorption layer. A passivation layer is formed on the wider bandgap layer. A doping layer is formed on the passivation layer. The doping layer is then patterned and dopant is driven from the patterned doping layer into the junction layer and the radiation absorption layer to form a doped region. The passivation layer is patterned to expose the doped region and an electrical contact to the doped region is formed.

12 Claims, 3 Drawing Sheets

PLANAR GEOMETRY BURIED JUNCTION INFRARED DETECTOR AND FOCAL PLANE ARRAY

FIELD OF THE INVENTION

The present invention relates to the field of solid state infrared detection devices. More specifically, the present invention relates to a method of fabricating infrared detection devices and the product thus produced.

BACKGROUND OF THE INVENTION

Compound semiconductor materials have proven useful in a variety of applications. One such compound is Mercury Cadmium Telluride (HgCdTe). This compound semiconductor is particularly useful in detection of infrared radiation. Infrared radiation is a nearly universal byproduct of heat generation. Thus, detection of infrared radiation provides the ability to locate heat sources when visible location is not feasible, such as at night, Infrared detection also has numerous applications in law enforcement, military and other public safety fields. HgCdTe is particularly useful for infrared detection because it can be "tuned" to a particular wavelength region of interest. This is accomplished by varying the proportions of Mercury and Cadmiun in the alloy.

However, HgCdTe devices have proven to be particularly difficult to manufacture. To achieve the desired performance, some devices require cooling devices to keep the detector at a temperature that allows for adequate sensitivity in infrared to allow measurable affects. Uncooled detectors have also been developed. These detectors provide acceptable performance without the need for cooling devices. An example of this type of device can be found in Eden, "Uncooled Infrared Detector," U.S. Pat. No. 6,100,525, which is assigned to the assignee of this application and which is hereby incorporated by reference. Some devices require elaborate and costly manufacturing techniques. Examples of these processes include Eden et al, "Method for Fabricating an Infrared Radiation Detector," U.S. Pat. No. 6,198,100 B1, which is assigned to the assignee of this application and which is hereby incorporated by reference, and Chandra et al., "Integrated Infrared Detection System," U.S. Pat. No. 6,091,127. These elaborate processes are required by limitations of HgCdTe crystal structures.

To create an effective detector, it is necessary to form a portion of the HgCdTe crystal with a mercury to cadmium ratio tuned to the selected detection wavelength band. Then a detector area must be isolated. This allows for measurement of electrical effects on the isolated region caused by the absorption of infrared photons. Most prior techniques for isolating detectors require formation of the HgCdTe crystal mesas. The surfaces of the mesas provide a large area for potential surface recombination of carriers, which reduces the performance of the device. In addition, if the substrate is a crystal having a different lattice structure than the mesa, internal strains in the epitaxial layers cause dislocations which limit the performance of the detector. It is therefore desirable to provide a detector structure and manufacturing process that does not include the need for mesa-type structures. Furthermore, the materials ought to have a minimum of dislocations, especially at the layer interface.

For planar geometry, non-mesa detectors, prior manufacturing techniques use ion implantation to form doped regions for detectors. However, implantation causes damage to the crystal structure of the detector that is difficult to anneal away. This reduces the integrity of the crystal structure, which may provide another source of leakage and carrier recombination.

BRIEF SUMMARY OF THE INVENTION

The described embodiments of the present invention include a method for forming a radiation detector, including the steps of: forming a radiation absorption layer on a substrate; forming a wider bandgap layer on the radiation absorption layer; forming a passivation layer on the junction layer; forming a doping layer on the passivation layer; patterning the doping layer; driving dopant from the patterned doping layer into the junction layer and the radiation absorption layer to form a doped region; patterning the passivation layer to expose the doped region; and forming an electrical contact to the doped region.

Another described embodiment of the present invention is a radiation detector. This embodiment includes a radiation absorption layer formed on a substrate and a junction layer formed on the radiation absorption layer. This embodiment further includes a passivation layer formed on the junction layer; a patterned doping layer formed on the passivation layer and a doped region formed by driving dopant from the patterned doping layer into the junction layer and the radiation absorption layer and an electrical contact formed through a via in the passivation layer to provide electrical contact with the doped region.

BRIEF DESCRIPTION OF THE DRAWINGS

For a more complete understanding of the present invention and the advantages thereof, reference should be made to the following Detailed Description taken in connection with the accompanying drawings in which.

DETAILED DESCRIPTION OF THE INVENTION

Figure 1:
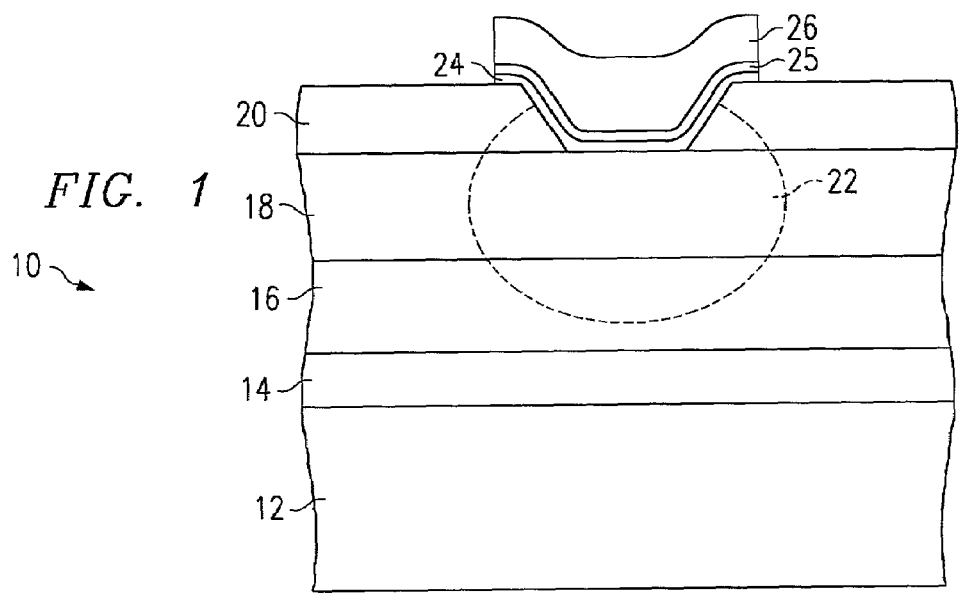
FIG. 1 is a cross-sectional diagram of a radiation detector according to one embodiment of the present invention that is fabricated according to a described process, which is another embodiment of the present invention.

FIG. 1 is a cross-sectional diagram of a radiation detector, which is an embodiment of the present invention. Detector 10 is designed to absorb specific bands of infrared energy. Detector 10 is formed on substrate 12, which is preferably a wafer of Cadmium Zinc Telluride (CdZnTe). A buffer layer 14 composed of CdZnTe is formed on the surface of substrate 12 to provide isolation and a high quality crystal for subsequent layer formation.

Absorber layer 16 is a crystal of Mercury Cadmium Zinc Telluride (HgCdZnTe). HgCdZnTe crystals have the property of absorbing infrared radiation (IR). This absorption characteristic can be "tuned" to a specific wavelength of IR by altering the relative mole fractions of Mercury and Cadmium in the crystalline layer. In the current embodiment, absorber layer 16 is doped n-type using Iodine or Indium. Of course, other doping configurations may be used and remain within the scope of the invention. Wider bandgap layer 18 is formed on the surface of absorber layer 16 and is also a layer of n doped HgCdZnTe. However, wider bandgap layer 18 has a different relative mole concentration of Mercury and Cadmium so that wider bandgap layer 18 does not absorb infrared radiation of the target wavelength and has a wider band gap. This wider band gap provides increased sensitivity for detector 10. Wider bandgap layer 18 may be omitted from the embodiment of FIG. 1 at the cost of some sensitivity.

Passivation layer 20 is an electrically inert layer of CdZnTe that prevents surface recombination of carriers. Carriers in layers 16 and 18 are generated by the impact of photons, and thus comprise the desired signal. Passivation layer 20 minimizes the surface recombination effects.

Doped region 22 is a p-type region that extends from the surface of wider bandgap layer 18 into absorber layer 16. Doped region 22 is formed by the diffusion of Arsenic into layers 16 and 18 as described below. Contact to doped region 22 is provided by nickel layer 24, gold layer 25 and indium layer 26.

Figure 2:
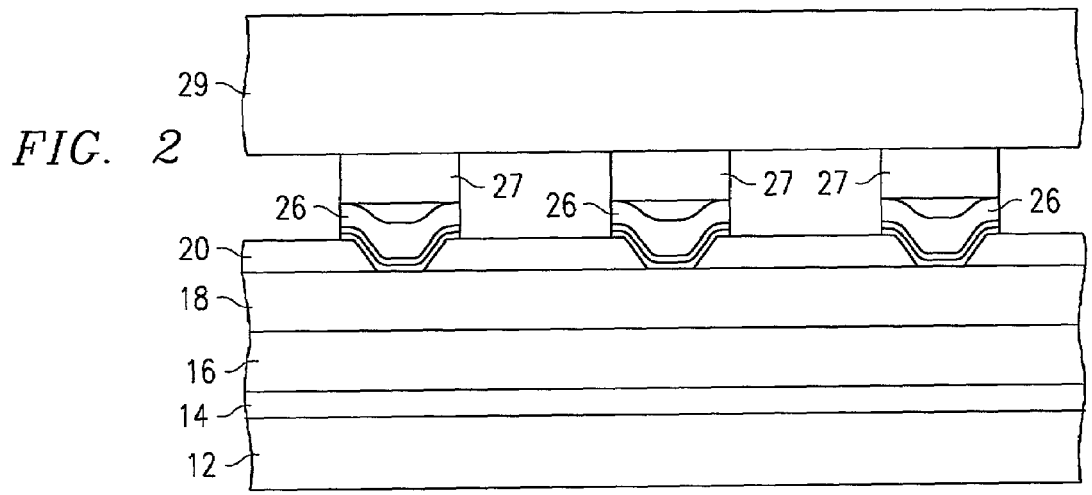
FIG. 2 is a cross-sectional diagram showing an array of radiation detectors connected to detection circuitry.

In a preferred embodiment, a plurality of detectors are formed in a single substrate as shown in FIG. 2. The plurality of detectors are preferably laid out in a regular array with a spacing pitch of 20 to 100μ. The array may consist of 1,000 or more detectors per row by 1,000 or more detectors per column. A preferred embodiment is an array of 640 by 480 pixels, which corresponds to VGA type PC computer monitor resolution. Each detector 10 includes a bump formed by indium layer 26, which extends approximately 6μ above the surface of passivation layer 20. These bumps are mated with corresponding indium bumps 27, which are formed on the surface of a readout integrated circuit 29.

Readout integrated circuit 29 is a formed in a silicon crystal substrate and contains circuitry that detects when a charge has been created in a detector 10. This charge is cause by movement of carriers created by absorption of photons having the desired wavelength 28. Indium bumps 27 are bonded to indium layers 26 using compression and/or annealing techniques. To minimize reflective losses of radiation, the lower surface of substrate 12 is coated with an anti-reflective coating.

When infrared radiation within the cut-off wavelength of the absorber layer strikes detector 10, the energy of the radiation is absorbed by absorber layer 16. The photo-generated carriers produce a photo current measurable via the contact provided by layers 24 and 26. Thus, the infrared radiation is detected based on the same principals as a standard PN junction photo diode detection. The fabrication of detector 10 is described below in conjunction with FIGS. 3 through 8.

In a preferred embodiment, a large number of detectors 10 are formed on a single substrate. Data is gathered from each of the detectors and is processed using known analog and digital processing techniques. For example, the electrical signal can be converted to a digital representation using analog to digital conversion and the resulting data may be processed using a digital signal processor. Many configurations of the device will become apparent to those skilled in the art in light of the teachings of this specification.

Figure 3:
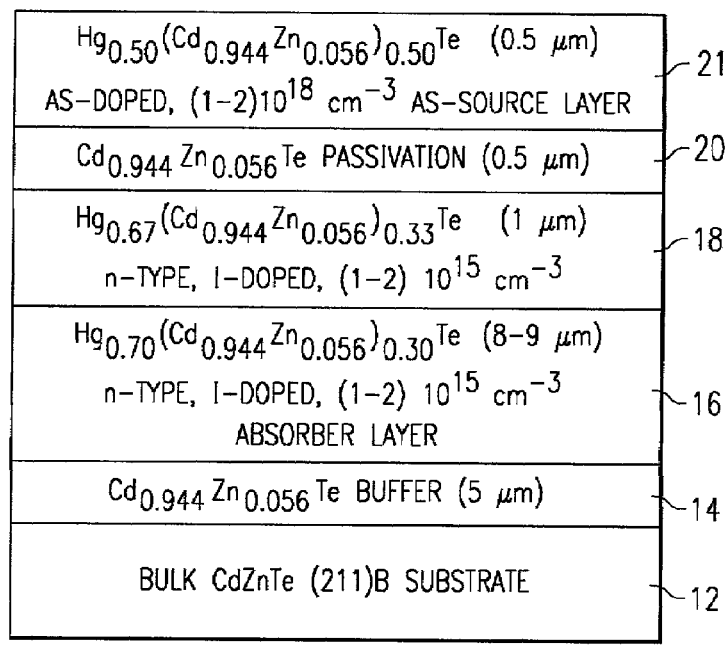
FIG. 3 is a cross-sectional diagram showing initial steps in a process that constitutes one embodiment of the present invention.

A preferred method for fabricating the detector 10 is best described in conjunction with FIGS. 3 through 8. FIG. 3 is a cross-sectional diagram showing the results of the initial steps in fabricating detector 10. Substrate 12 is a wafer of CdZnTe, which is commericially available. Buffer layer 14 is composed of CdZnTe and is deposited using known deposition techniques. Examples of suitable techniques are chemical vapor deposition and molecular beam epitaxy. The preferred technique is metal-organic chemical vapor deposition (MOCVD). In the present embodiment, buffer layer 14 has a composition of 0.944 moles Cd and 0.056 moles Zn for every mole of Te. This composition adjusts the lattice constant of buffer layer 14 to be nearly equal to that of HgTe. This factor is important for subsequent fabrication steps as described below. Buffer layer 14 provides a high quality crystalline layer with a uniform distribution of Zn. In addition, buffer layer 14 can be consistently formed without electrically active impurities. Commercially available substrates do not provide the uniform distribution of Zn and lack of electrically active impurities necessary to form high quality detector material. This uniform distribution of Zn provides consistency in the lattice constant on the surface of buffer layer 14.

Absorber layer 16, wider bandgap layer 18, passivation layer 20, and p-doped layer 21 are then preferably formed using the technique described in Mitra, "Method of Fabrication for Mercury-Based Quaternary Alloys of Infrared Sensitive Materials," U.S. Pat. No. 5,998,235, which was invented by the inventor of the present invention, and is assigned to the assignee of the present invention and is hereby incorporated by reference. Each of these layers is formed by a in situ process of MOCVD. The work piece is not removed from the deposition chamber until the last layer is formed. This means that the sensitive absorber layer 16 is never exposed to contamination. Both the dectector layer 16 and wider bandgap layer 18 are protected by passivation layer 20 from their initial formation. Of importance, the junction region between the detector layer 16 and the wider bandgap layer 18 is never exposed to contamination. Only p-doped layer 21, which is a sacrificial layer as explained below, is exposed to contamination outside of the deposition chamber. In addition, there is no need for a clean up step prior to formation of passivation layer 20. Prior art techniques use a clean up step prior to forming passivation layers because the work piece must be removed from the deposition chamber. Ironically, this clean up step is a significant source of contamination. The in situ process of this embodiment of the present invention greatly enhances the yield and quality of the process in accordance with the present invention.

Each layer of the process has a chemical composition described by the formula:

$$Hg_{1-x}(Cd_{1-y}Zn_y)_xTe$$

where,
x is a factor indicating the relative mole concentration of Hg to Cd, thus controlling the infrared absorption properties of the material; and
y is a factor indicating the relative mole concentration of Cd to Zn, which controls the lattice constant.

Figure 4:
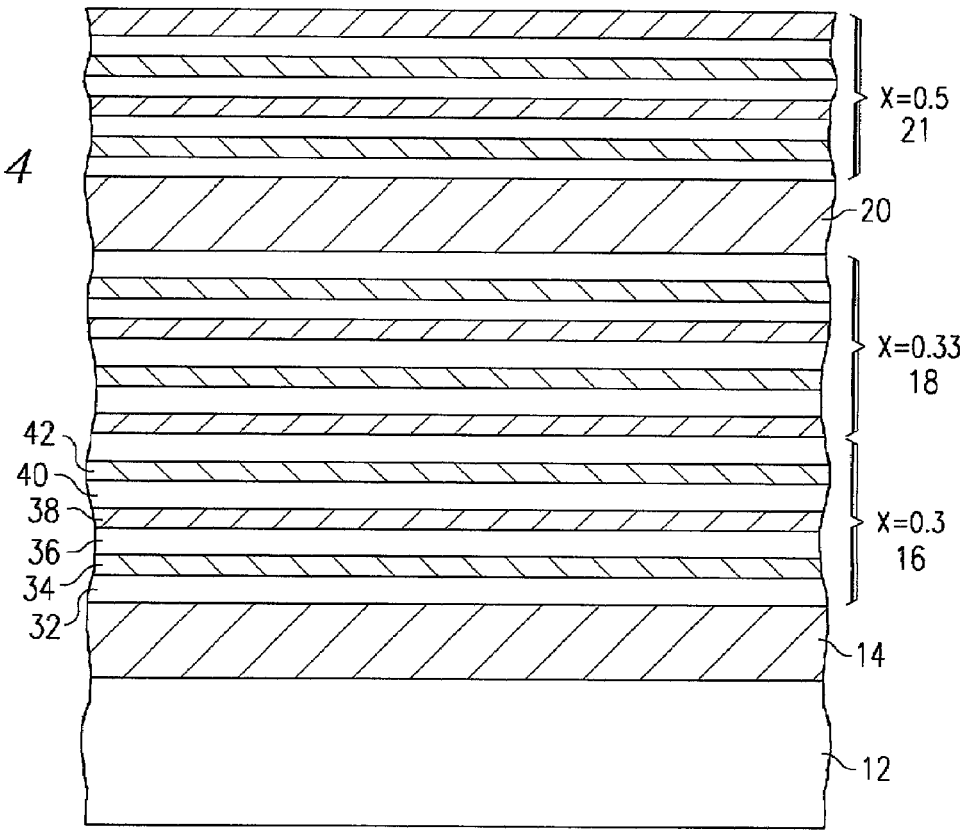
FIG. 4 is a cross-sectional diagram showing an intermediate step leading to the structure shown in FIG. 1.

The specific factor x is determines, among other properties, the wavelength of radiation that will be absorbed. Each of these layers is initially deposited as alternating precursor layers of HgTe and $(Cd_{0.944}Zn_{0.056})$Te. To provide a CdZnTe layer having a lattice constant equal to that of HgTe, y is set to 0.056. For example, as shown in FIG. 4, absorber layer 16 is formed as alternating layers of HgTe (32, 36, 40) and $Cd_{0.944}Zn_{0.056}$Te (34, 38, 42). The alternating precursor layers are actually much thinner than indicated in FIG. 4. It is desirable that the thickness of the alternating layers be thin enough so that these layers completely alloy to provide layers having uniform composition. For $Cd_{0.944}Zn_{0.056}$Te, this is approximately 25 nm. For HgTe, that thickness is approximately 75 nm.

For example, in this embodiment, absorber layer 16 is approximately 8–9μ thick with x=0.3. The $Cd_{0.944}Zn_{0.056}$Te precursor layers are held to 20 nm to keep them well under the 25 nm threshold. To provide the appropriate Hg concentration, the HgTe precursor layers must be approximately 46.6 nm thick. To provide an absorption layer of 8–9μ, there are approximately 120 to 135 $Cd_{0.0944}Zn_{0.056}$Te layers and the same number of HgTe layers in the precursor to absorber layer 16. Layers 18, 20 and 21 are formed using the same process with the following differences.

Layers 16 and 18 include Iodine in their formation such that the final Iodine concentration is approximately $1-2 \times 10^{15}$ atoms/cm$^3$. This is provided in the form of an Iodine bearing species introduced with the gases that form the precursor layers in the MOCVD process. This dopes layers 16 and 18 to n-type. The thickness of the HgTe layers is adjusted to 40 nm in layer 18 and 20 nm in layer 21. Layer 20 is pure $Cd_{0.944}Zn_{0.056}$Te. Finally, doping layer 21 is formed with Arsenic (As) atoms to provide a final As concentration of approximately $1-2 \times 10^{18}$ atoms/cm$^3$. The entire stack is annealed at approximately 360° C. for 10–20 minutes to interdiffuse the HgTe and $Cd_{0.944}Zn_{0.056}$Te to provide the layers shown in FIG. 3.

Figure 5:
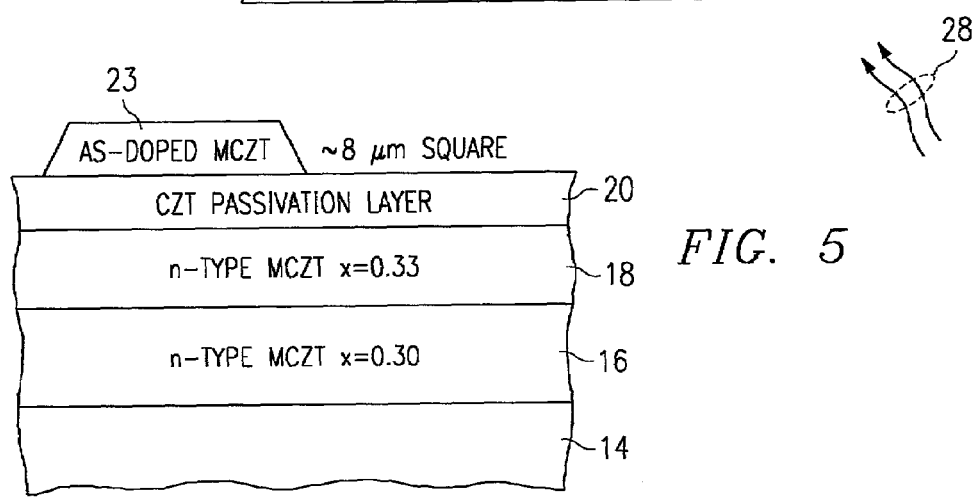
FIG. 5 is a cross-sectional diagram showing another step leading to the structure of FIG. 1 where the doping layer is patterned.
Figure 6:
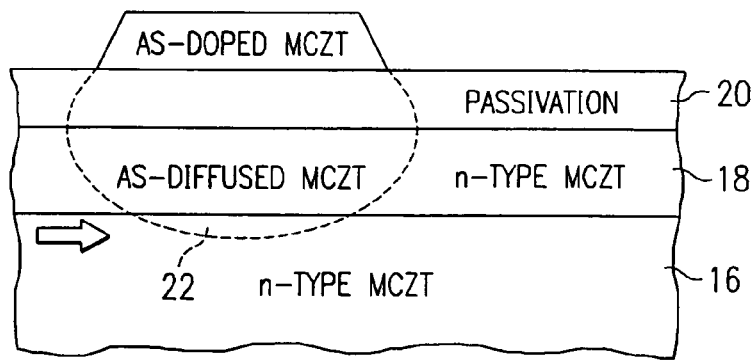
FIG. 6 is a cross-sectional diagram showing another step leading to the structure of FIG. 1 showing the formation of a diffused doped region.

After formation of layers 14, 16, 18, 20 and 21, doping layer 21 is patterned to provide doped mesa 23 as shown in FIG. 5. P-doped layer 21 is etched using a photolithographically formed mask (not shown) and known wet etching techniques. The mask is then removed and resulting structure of FIG. 5 is then annealed at a temperature of approximately 400° C. for approximately 10 to 15 minutes. This causes As dopant atoms to diffuse through passivation layer 20 into wider bandgap layer 18 and absorber layer 16 to form doped region 22 as shown in FIG. 6. The concentration of the dopant in doped region 22 is selected according to the wavelength of radiation to be absorbed to optimized detection efficiency. Exemplary concentrations include from $1 \times 10^{16}$ atoms/cm$^3$ for radiation having a wavelength of approximately 1.5μ to $0.5 \times 10^{15}$ atoms/cm$^3$ for radiation having a wavelength of approximately 18μ.

Figure 7:
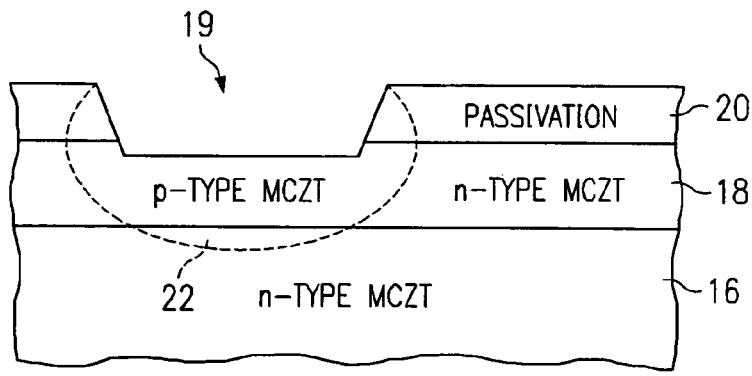
FIG. 7 is a cross-sectional diagram showing another step leading to the structure of FIG. 1 where a contact via is formed.
Figure 8:
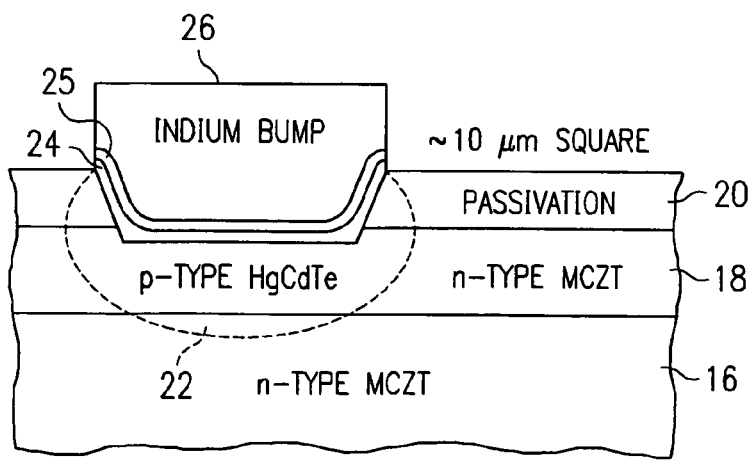
FIG. 8 is a cross-sectional diagram showing another step leading to the structure of FIG. 1 where a contact is formed through the contact via.

Doped mesa 23 is then removed using a mask that is substantially the inverse of the mask used to form doped mesa 23. The material of doped mesa 23 is etched using known etching techniques. This inverse mask (not shown) is also used to etch passivation layer 20, which is etched using reactive ion etching with a methyl ion source, to form via 19 as shown in FIG. 7. A layer of nickel 24 followed by a layer of gold 25 is then deposited and patterned as shown in FIG. 8. Nickel layer 24 serves as a diffusion barrier to prevent diffusion of gold into layers 16, 18 and 20. Gold layer 25 is then used as a seed site for selective deposit of Indium to form Indium layer 26 as shown in FIG. 8 using known techniques. Thus the completed detector 10 is formed.

Ideally, an array of detectors will be used with hybridized supporting circuitry (not shown). In addition, an antireflective coating (not shown) may be used on the back side of substrate 12 (i.e., away from Indium layer 26) to maximize detection accuracy.

The present invention provides a high quality detector using only doping isolation as opposed to the prior techniques that require more elaborate isolation. Because of the fabrication techniques used, the described embodiments include an absorption layer of high quality crystal. The precursor layers for the absorption, contact and passivation layers are all formed in situ with a continuous process. This insures that the aborption layer is never exposed to contamination. This avoids the leakage inherent in prior structures and manufacturing techniques and allows for effective use of junction isolation.

Although specific embodiments are disclosed herein, they are not to be construed as limiting the scope of the present invention. Many variants of the present invention will become apparent to those skilled in the art in light of the teaching of this specification. For example, via 19 may be part of an elongated column lead to provide contact to a linear group of detector cells. The scope of the invention is only limited by the claims appended hereto.

What is claimed is:

1. A radiation detector formed by a process comprising:
   forming a radiation absorption layer above a substrate;
   forming a wider bandgap layer above the radiation absorption layer;
   forming a passivation layer above the wider bandgap layer;
   forming a patterned doping layer above the passivation layer;
   driving dopant from the patterned doping layer into the wider bandgap layer and the radiation absorption layer; and
   forming an electrical contact to provide electrical contact to the doped region.

2. A radiation detector as in claim 1 wherein the absorption layer includes HgCdTe.

3. A radiation detector as in claim 1 wherein the absorption layer includes $Hg_{1-x}(Cd_{0.944}Zn_{0.056})_x$ Te.

4. A radiation detector as in claim 1 wherein a dopant of the doped region is p-type.

5. A radiation detector as in claim 1 wherein a dopant of the doped region is arsenic.

6. A radiation detector as in claim 1 wherein the radiation absorption layer is adapted to detect infrared radiation.

7. A radiation detector formed by a process comprising:
   forming a radiation absorption layer above a substrate;
   forming a passivation layer above the radiation absorption layer;
   forming a patterned doping layer above the passivation layer;
   driving dopant from the patterned doping layer into the radiation absorption layer; and
   forming an electrical contact to provide electrical contact to the doped region.

8. A radiation detector as in claim 7 wherein the absorption layer includes HgCdTe.

9. A radiation detector as in claim 7 wherein the absorption layer includes $Hg_{1-x}(Cd_{0.944}Zn_{0.056})_x$ Te.

10. A radiation detector as in claim 7 wherein a dopant of the doped region is p-type.

11. A radiation detector as in claim 7 wherein a dopant of the doped region is arsenic.

12. A radiation detector as in claim 7 wherein the radiation absorption layer is adapted to detect infrared radiation.

* * * * *